United States Patent
Mogi (10) Patent No.: US 12,038,888 B2
(45) Date of Patent: Jul. 16, 2024

(54) STORAGE CONTROL APPARATUS AND METHOD

(71) Applicant: Hitachi, Ltd., Tokyo (JP)

(72) Inventor: Kazuhiko Mogi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 18/110,023

(22) Filed: Feb. 15, 2023

(65) Prior Publication Data
US 2024/0070126 A1 Feb. 29, 2024

(30) Foreign Application Priority Data
Aug. 30, 2022 (JP) .................. 2022-136805

(51) Int. Cl.
*G06F 16/20* (2019.01)
*G06F 16/21* (2019.01)
*G06F 16/22* (2019.01)
*G06F 16/23* (2019.01)

(52) U.S. Cl.
CPC ............ *G06F 16/212* (2019.01); *G06F 16/22* (2019.01); *G06F 16/2365* (2019.01)

(58) Field of Classification Search
CPC ..... G06F 16/212; G06F 16/22; G06F 16/2365
See application file for complete search history.

(56) References Cited

U.S. PATENT DOCUMENTS

| 5,619,199 | A | 4/1997 | Watts et al. |
| 10,114,846 | B1 | 10/2018 | Shah et al. |
| 10,268,726 | B1 | 4/2019 | Schiesser |
| 10,931,302 | B2 | 2/2021 | Lyle |
| 10,997,147 | B2 | 5/2021 | Yan et al. |
| 2019/0155930 | A1* | 5/2019 | Fender ................ G06F 16/2282 |
| 2020/0341983 | A1* | 10/2020 | Kirk .................... G06F 16/2255 |

* cited by examiner

*Primary Examiner* — Kristopher Andersen
(74) *Attorney, Agent, or Firm* — MATTINGLY & MALUR, PC (57) ABSTRACT

A storage control apparatus generates an evaluated compression dictionary from a compression dictionary. The compression dictionary includes, for each of different values included in original data of compressed data, a value and a compression code. The evaluated compression dictionary includes, for each value in the compression dictionary, a value and a compression code. The compressed data includes a compression code for each value in the original data. The storage control apparatus performs, in generation or update of the evaluated compression dictionary, condition evaluation of the value. A compression code of a value determined to correspond to the search condition in the condition evaluation is a condition satisfied code. The storage control apparatus is configured to, in the search, for a compression code in the search range of the compressed data: output, when there is an evaluation dictionary record including a condition satisfied code matching the compression code, a value in the evaluation dictionary record; and output, when there is no evaluation dictionary record including a condition satisfied code matching the compression code, a value that means inconsistency.

5 Claims, 7 Drawing Sheets

EXTERNAL STORAGE MANAGEMENT DATA
124

| TABLE ID | SEGMENT AREA |
|---|---|
| Tbl1 | 1 - A3895 |
| Tbl2 | A3896-B8392 |
| ⋮ | ⋮ |

134 — TABLE ID
136 — SEGMENT AREA

COMPRESSION DICTIONARY
170

| COMPRESSION CODE | COLUMN VALUE |
|---|---|
| 1 | 0.01 |
| 2 | 0.04 |
| ⋮ | ⋮ |

DELAY EVALUATION COMPRESSION DICTIONARY
1700

| COMPRESSION CODE | COLUMN VALUE | CONDITION EVALUATION RESULT |
|---|---|---|
| 1 | 0.01 | Unevaluated |
| 2 | 0.04 | True |
| ⋮ | ⋮ | ⋮ |

FIG. 8

STORAGE CONTROL APPARATUS AND METHOD

CROSS-REFERENCE TO RELATED APPLICATION

The present application claims priority from Japanese application JP2022-136805, filed on Aug. 30, 2022, the contents of which is hereby incorporated by reference into this application.

BACKGROUND

The present invention generally relates to storage control, and particularly relates to search.

As a method for reducing storage capacity to be consumed, a method for compressing and storing data has been generally known. PTL 1 indicates that evaluation of a LIKE predicate is executed with compressed data. PTL 2 indicates that, when text data is compressed, keys (codes) are maintained in a dictionary order.

CITATION LIST

Patent Literature

[PTL 1] U.S. Pat. No. 10,931,302
[PTL 2] U.S. Pat. No. 5,619,199

SUMMARY

In addition to reducing the amount of storage space consumed, it is desirable to improve search performance. Neither of the technologies disclosed in patent documents PTL 1 and PTL 2 has high search performance.

In regard to a system in which data is compressed and stored, a storage control apparatus holds a compression dictionary. The compression dictionary is data constituted of two or more dictionary records corresponding to different two or more values among a plurality of values included in original data of compressed data. Each of two or more dictionary records includes any of the different two or more values and a compression code of the value. Compressed data includes, for each value in the original data, a compression code of the value. The storage control apparatus receives a search request that designates a search range and a search condition, and generates from the compression dictionary an evaluated compression dictionary constituted of one or more evaluation dictionary records. Each of one or more evaluation dictionary records includes any of different two or more values in the compression dictionary and a compression code of the value. The storage control apparatus performs condition evaluation as to whether a value corresponds to the search condition in the generation or update of the evaluated compression dictionary. The compression code of a value determined to correspond to the search condition in the condition evaluation is a condition satisfied code. In a search, the storage control apparatus performs the following for a compression code belonging to a search range of compressed data.

- When there is an evaluation dictionary record including a condition satisfied code matching the compression code, a value in the evaluation dictionary record is output.
- When there is no evaluation dictionary record including a condition satisfied code matching the compression code, a value that means inconsistency is output.

According to the present invention, high search performance for a system, in which data is stored after being compressed, can be provided.

DESCRIPTION OF EMBODIMENTS

In the following description, "interface apparatus" may be one or more communication interface devices. One or more communication interface devices may be the same kind of one or more communication interface devices (for example, one or more network interface cards (NIC)), or may be two or more of different kinds of communication interface devices (for example, NIC and host bus adapter (HBA)).

Furthermore, in the following description, "memory" is one or more memory devices as an example of one or more storage devices, and, typically, may be a main storage device. At least one memory device in a memory may be a volatile memory device or a non-volatile memory device.

Furthermore, in the following description, a "permanent storage apparatus" may be one or more permanent storage device as an example of one or more storage devices. The permanent storage device may be typically a non-volatile storage device (for example, auxiliary storage device), and specifically, for example, may be a hard disk drive (HDD), a solid state drive (SSD), or a non-volatile memory express (NVMe) drive.

Furthermore, in the following description, "processor" may be one or more processor devices. At least one processor device may be, typically, a microprocessor device such as a central processing unit (CPU), or may be another kind of processor device such as a graphics processing unit (GPU). At least one processor device may be a single core processor or a multi-core processor. At least one processor device may be a processor core. At least one processor device may be a processor device in a broad sense, such as a hardware circuit for performing a part or while of processing (for example, field-programmable gate array (FPGA), complex programmable logic device (CPLD), and application specific integrated circuit (ASIC)).

Furthermore, in the following description, a function is sometimes described in an expression of "yyy unit", but the function may be implemented when one or more computer programs are executed by a processor, may be implemented by one or more hardware circuits (for example, FPGA or ASIC), or may be implemented by a combination thereof. When a function is implemented when a program is executed by a processor, predetermined processing is performed as appropriate by using a storage apparatus and/or an interface apparatus, and hence the function may be at least a part of the processor. Processing that is described with a function as a subject may be processing performed by a processor or an apparatus having the processor. A program may be installed from a program source. The program source may be, for example, a program distributing computer or a computer-readable storage medium (for example, non-transitory storage medium). Descriptions of functions are illustrative. A plurality of functions may be integrated as one function, or one function may be divided into a plurality of functions.

Some embodiments are described below. Note that, in the following description, "DB" is an abbreviation for a database.

First Embodiment

Figure 1:
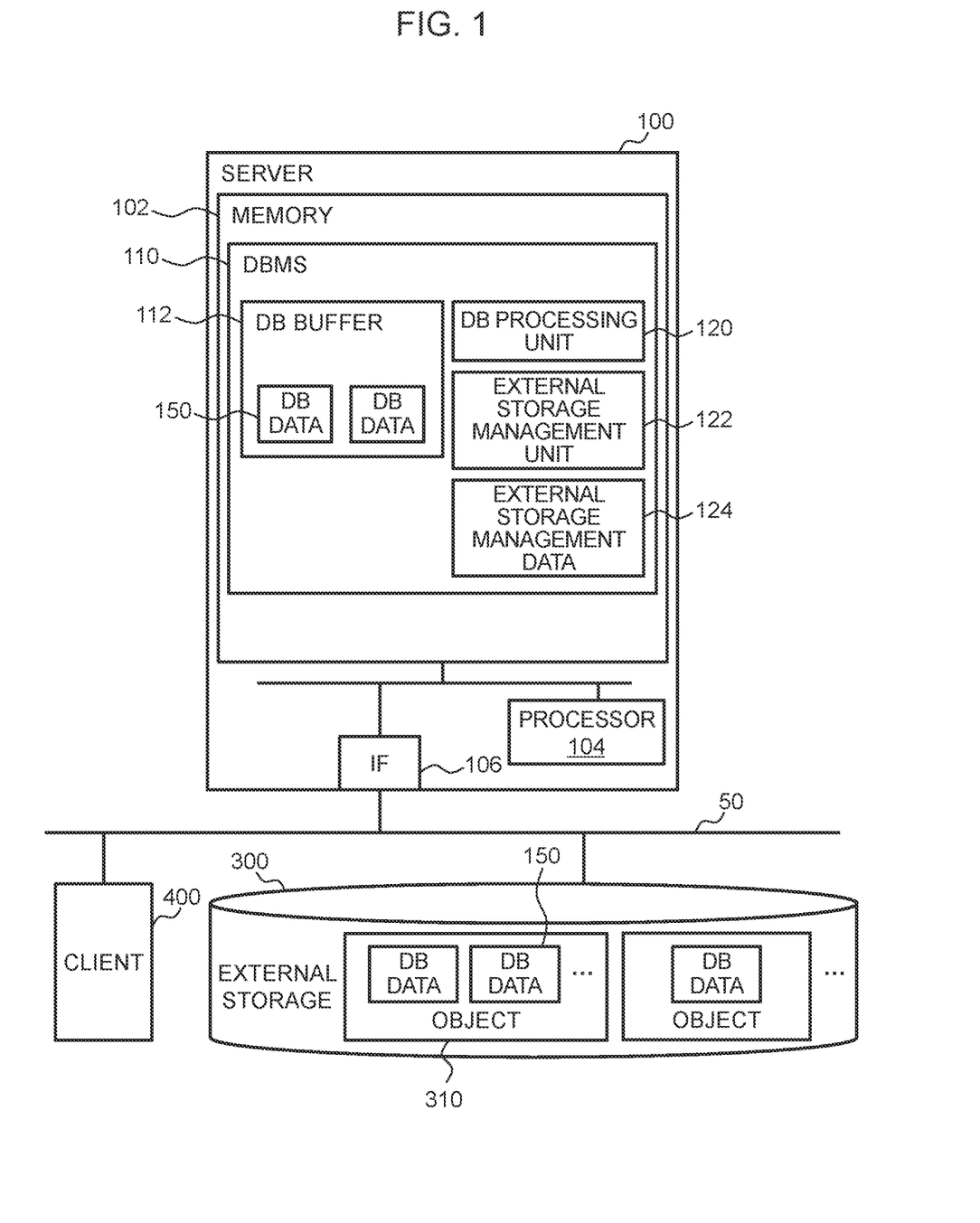
FIG. 1 illustrates a configuration example of the entire system according to a first embodiment.

FIG. 1 illustrates a configuration of the entire system according to a first embodiment.

A client 400, an external storage 300, and a server 100 (example of storage control apparatus) are coupled to a communication network 50 (for example, Internet).

The client 400 is an example of a transmission source of a DB operation request for the server 100. The DB operation request may be called "DB query", and may be, for example, a request of Select, Update, Delete, Insert, or Import. The DB operation request may be, for example, an SQL, and may be an example of a search request.

The external storage 300 is an external storage for the server 100. The external storage 300 in the present embodiment is a cloud storage in a public cloud (storage as cloud computing service).

The server 100 is, for example, an on-premise server, and has an interface apparatus 106, a memory 102, and a processor 104 coupled thereto.

The interface apparatus 106 performs communication through the communication network 50.

The memory 102 is, for example, a volatile memory (typically, main storage memory). The memory 102 stores therein software for implementing a database management system (DBMS) 110. The DBMS 110 is implemented when the processor 104 executes the software.

The DBMS 110 manages a DB buffer 112 and external storage management data 124. Furthermore, the DBMS 110 has functions as a DB processing unit 120 and an external storage management unit 122.

A DB space (database address space) managed by the DBMS 110 is constituted by a plurality of pages. In other words, the minimum unit of data in a database is a page. In the following description, data in page units is called "DB data".

In this manner, a data unit to be input to and output from the DB buffer 112 is DB data 150, but a data unit to be input to and output from the external storage 300 is an object 310. In other words, the external storage 300 as a cloud storage is an object storage in the present embodiment. The object 310 is a set of a plurality of pieces of DB data 150. In other words, the size of the object 310 is larger than that of DB data 150 (page). The size of the object 310 may be fixed, but in the present embodiment, the size of the object 310 is variable.

In the present embodiment, a database is managed by the DB data unit, and stored in the external storage 300 in an object unit, but another storage may be employed for the storage as a database. For example, the external storage 300 may be omitted, and a database may be stored in a storage apparatus (including the memory 102) in the server 100.

Figure 2:
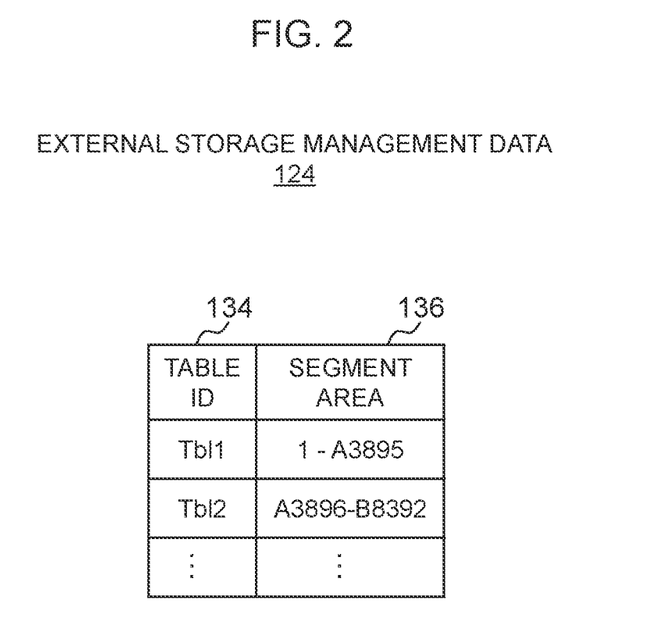
FIG. 2 illustrates a configuration example of external storage management data.

FIG. 2 illustrates a configuration example of the external storage management data 124.

The external storage management data 124 has an entry for each table in a database. The entry includes data such as a table ID 134 and a segment area 136. The table ID 134 indicates an ID of a table in a database. The segment area 136 indicates each ID of one or more segments in which a table is stored. The "segment" may be an area constituted by a plurality of pages. The segment area 136 may be a logical address range.

Figure 3:
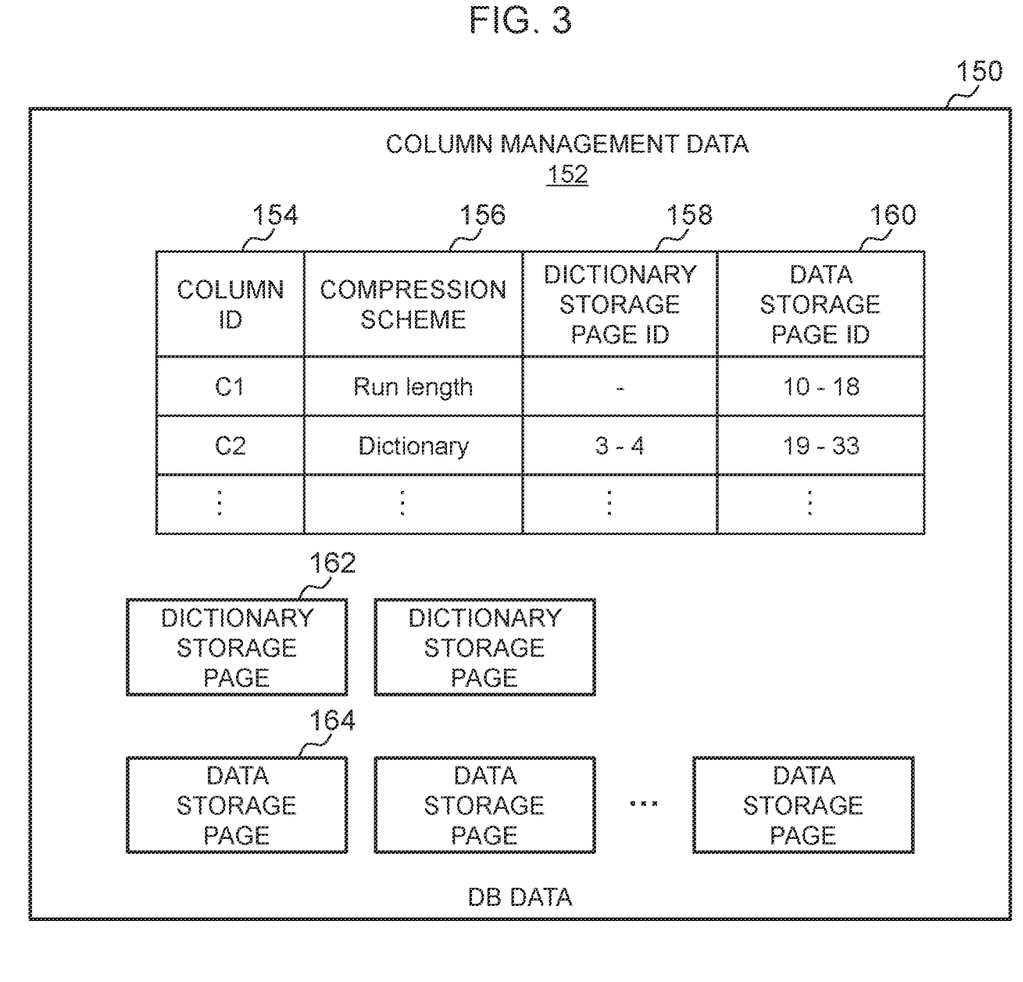
FIG. 3 illustrates an example of contents in DB data.

FIG. 3 illustrates an example of contents in the DB data 150.

The DB data 150 includes column management data 152, one or a plurality of dictionary storage pages 162, and one or a plurality of data storage pages 164.

The column management data 152 has an entry for each column of a table in a database. The entry includes data such as a column ID 154, a compression scheme 156, a dictionary storage page ID 158, and a data storage page ID 160.

The column ID 154 indicates an ID of a column. The compression scheme 156 indicates a compression scheme of a column. The dictionary storage page ID 158 indicates each ID of one or more dictionary storage pages 162 that are one or more pages in which a compression dictionary corresponding to a column is stored. The data storage page ID 160 indicates each ID of a data storage page 164 that is one or more pages in which columns are stored.

When the compression scheme of a column managed by the column management data 152 is "Dictionary", a compression dictionary is stored. In other words, when a column in which the compression scheme is "Dictionary" is not present as a management target for the column management data 152 in the DB data 150, there is no dictionary storage page 162 in the DB data 150.

A column includes a plurality of values. The value may be one or a plurality of codes or numerical values. Furthermore, each column compressed in accordance with a compression scheme of the column is stored in one or more data storage pages 164. A column compressed in accordance with a compression scheme "Dictionary" includes, for each value in the original column (column before compression) a compression code of the value.

Figure 4:
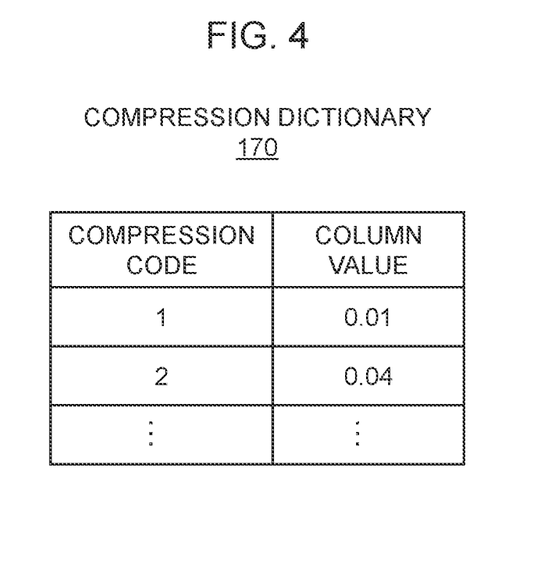
FIG. 4 illustrates a configuration example of a compression dictionary.

FIG. 4 illustrates a configuration example of a compression dictionary.

A compression dictionary 170 exists for each column of which the compression scheme is "Dictionary". The compression dictionary 170 is data having a dictionary record for each value in the original column (for each compression code in compressed column). The dictionary record includes a pair of a compression code and a column value. The compression code may have a fixed length or a variable length.

An example of processing performed in the present embodiment is described below.

Figure 5:
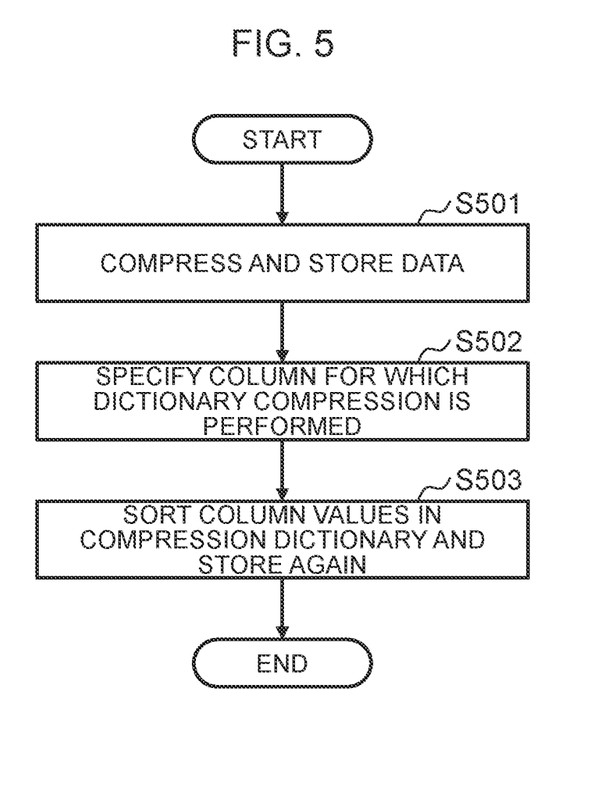
FIG. 5 illustrates an example of the flow of segment data storage processing.

FIG. 5 illustrates an example of the flow of segment data storage processing.

The DB processing unit 120 compresses each column in a table in accordance with a compression scheme of the column, and stores the column in a segment in units of DB data 150, and the external storage management unit 122 stores an object 310 including a plurality of pieces of DB data 150 in the external storage 300 (S501). In S501, for a column in which the compression scheme is "Dictionary", the DB processing unit 120 generates, for each of different two or more column values in the column, a compression dictionary 170 including the column value and a compression code of the column value (compressed column value).

The DB processing unit 120 specifies a column in which the compression scheme is "Dictionary" (S502), sorts dictionary records in the compression dictionary 170 corresponding to the column in a descending or ascending order of column values, and stores the sorted compression dictionary 170 in one or more dictionary storage pages 162 (S503). Note that the compression dictionary 170 may be prepared outside the server 100, input to the server 100, and stored in the memory 102.

Figure 6:
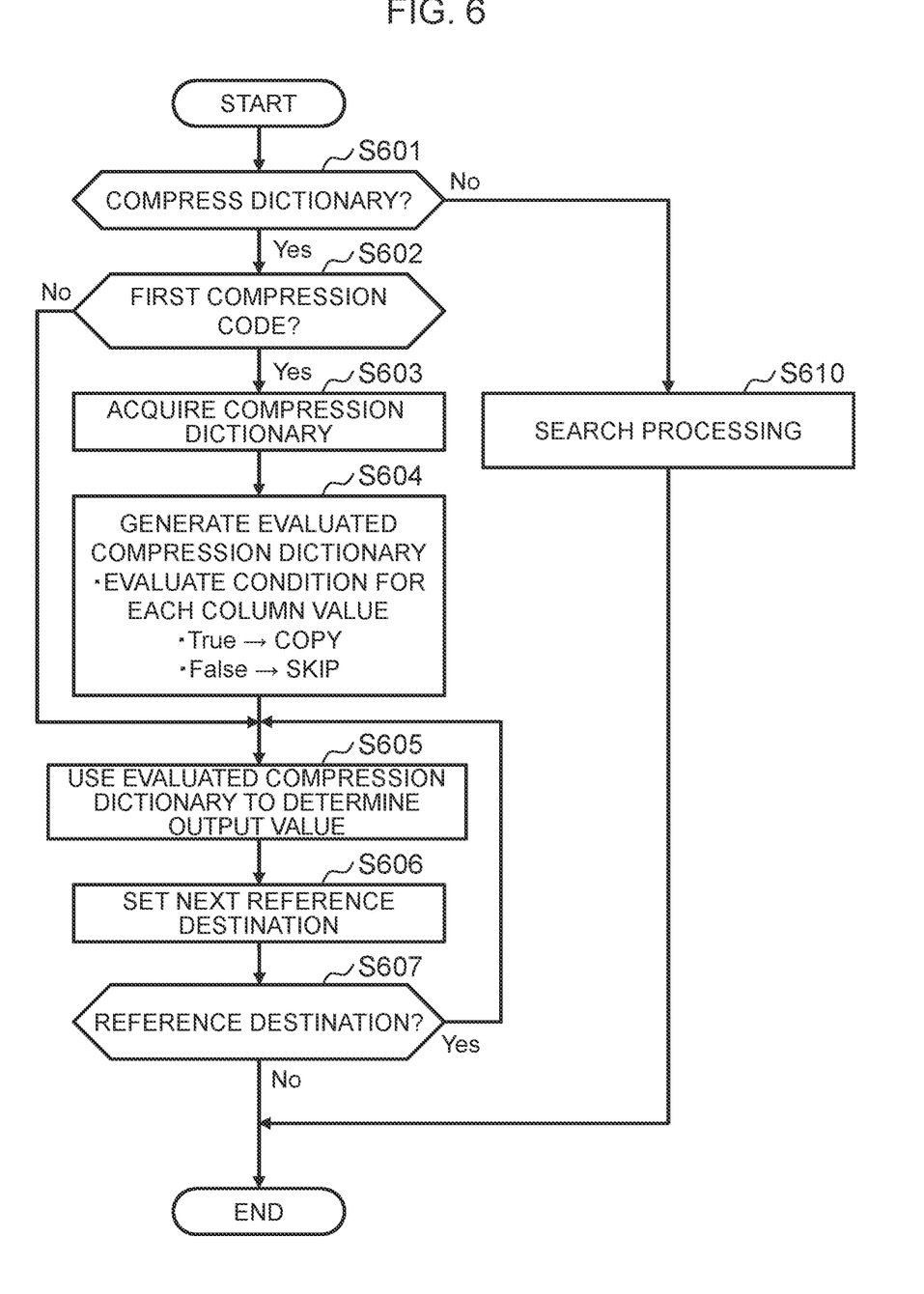
FIG. 6 illustrates an example of the flow of column acquisition processing according to the first embodiment.

FIG. 6 illustrates an example of the flow of column acquisition processing.

The "column acquisition processing" is started when the DB processing unit 120 receives a search request. In the search request, a search range and a search condition are designated. The DB processing unit 120 can refer to external storage management data 124 to specify a location of a table having the search range, and can refer to column management data 152 to specify a location of a column having the search range.

The DB processing unit 120 specifies from the column management data 152 whether a compression scheme corresponding to a compressed column as a search range is "Dictionary" (S601). When the determination result in S601 is false (S601: No), the DB processing unit 120 performs search processing in accordance with the compression scheme corresponding to the compressed column (S610).

When the determination result in S601 is true (S601: Yes), the DB processing unit 120 determines whether a reference destination of the compressed column is the first compression code in the segment (S602). The determination in S602 is an example of determination as to whether an evaluated compression dictionary for the current search of the compressed column (search in accordance with received search request) has been generated.

When the determination result in S602 is true (S602: Yes), the DB processing unit 120 acquires a compression dictionary 170 corresponding to the compressed column (S603). Specifically, the DB processing unit 120 specifies one or more dictionary storage pages 162 corresponding to the compressed column from the column management data 152 that manages the compressed column, and acquires a compression dictionary 170 from one or more specified dictionary storage pages 162.

The DB processing unit 120 generates an evaluated compression dictionary from the compression dictionary 170 (S604). The evaluated compression dictionary is data constituted by one or more evaluation dictionary records, and may include a copy of at least a part of dictionary records in the compression dictionary 170. Each of one or more evaluation dictionary records includes any of different two or more column values in the compression dictionary 170 and a compression code of the column value.

In S604 (that is, generation of evaluated compression dictionary), specifically, the DB processing unit 120 performs the following.

(a) The DB processing unit 120 acquires a column value from the first dictionary record of one or more unreferenced dictionary records in the compression dictionary 170.

(b) The DB processing unit 120 performs condition evaluation as to whether the column value acquired in (a) corresponds to a search condition designated by the search request.

(c1) In the condition evaluation (b), when it is determined that the column value acquired in (a) corresponds to the search condition (True), a dictionary record including the column value is copied, and a copy of the dictionary record is set as an evaluation dictionary record.

(c2) In the condition evaluation (b), when it is determined that the column value acquired in (a) does not correspond to the search condition (False), copying of a dictionary record including the column value is skipped.

(d) The DB processing unit 120 determines whether an unreferenced dictionary record in S604 is present in the compression dictionary 170. When the determination result in (d) is true, the processing returns to (a). When the determination result in (d) is false, S604 is finished.

In other words, according to the present embodiment, a compression code in each evaluation dictionary record in an evaluated compression dictionary is a condition satisfied code that is a compression code corresponding to a column value corresponding to a search condition. Furthermore, the evaluated compression dictionary is constituted by a copy of the whole or part of dictionary records in the compression dictionary 170.

For example, it is assumed that a search request is a Select sentence, and includes "where Discount between 0.04 and 0.06". In this case, the search range is a column "Discount", and the search condition is a column value of 0.04 or more and 0.06 or less. In this example, in the first dictionary record in the compression dictionary 170 illustrated in FIG. 4, the column value is "0.01", which does not correspond to the search condition, and hence the first dictionary record is not copied. On the other hand, in the second dictionary record, the column value is "0.04", which corresponds to the search condition, and hence a copy of the second dictionary record is included in an evaluated compression dictionary as an evaluation dictionary record.

After the evaluated compression dictionary is generated in this manner, the DB processing unit 120 compares a reference destination compression code in the compressed column with the evaluated compression dictionary, and determines an output value corresponding to the comparison result (output value included in response for search request) (S605). Specifically, the DB processing unit 120 performs the following.

When there is an evaluation dictionary record including a condition satisfied code matching the reference destination compression code, the DB processing unit 120 outputs a column value in the evaluation dictionary record (sets output value).

When there is no evaluation dictionary record including a condition satisfied code matching the reference destination compression code, the DB processing unit 120 outputs a value that means inconsistency (sets output value as value that means inconsistency).

The DB processing unit 120 sets the next reference destination for the compressed column (S606). When the next reference destination indicates a location of a compression code in the compressed column (S607: Yes), S605 is performed for the reference destination. When the next reference destination indicates the end of the compressed column (S607: No), the processing is finished. The DB processing unit 120 returns a response including an output value for each compression code in the compressed column to a transmission source (for example, client 400) of the search request.

From the above, in the present embodiment, an evaluated compression dictionary is generated from the compression dictionary 170. The evaluated compression dictionary includes a column value subjected to condition evaluation and a compression code corresponding to the column value.

In a search of which the search range is at least a part of compressed columns, a response corresponding to a result of comparison between an evaluated compression dictionary and a compression code in the search range is generated. In other words, in the present embodiment, condition evaluation is needed in the generation of an evaluated compression dictionary, but in a search, condition evaluation is not needed for a compression code of a column value subjected to condition evaluation (in one comparative example, condition evaluation is needed for all of compression codes in compressed column). When the number of column values in a column is M and the number of dictionary records constituting a compression dictionary 170 is N, it is in general expected that N is sufficiently smaller than M. From those reasons, high search performance for compressed columns can be provided.

Furthermore, in regard to a compression dictionary 170, it is not always required to sort dictionary records in a descending or ascending order of column values, but in the present embodiment, such sort is performed so that an evaluated compression dictionary is generated from a compression dictionary 170 in which dictionary records are sorted in a descending or ascending order of column values. Accordingly, reduction in generation processing load of an evaluated compression dictionary can be expected. Specifically, for example, when a search condition is a column value of 0.04 or more and 0.06 or less, if condition evaluation has been performed on the minimum column value of column values of "0.06" or more in the compression dictionary 170, condition evaluation is unnecessary for the subsequent column values. Thus, the generation processing load of an evaluated compression dictionary is reduced, and hence high search performance is provided.

Furthermore, in the present embodiment, the DB processing unit 120 performs condition evaluation before a search for a search range, and does not perform condition evaluation during a search. In other words, in any of one or more evaluation dictionary records constituting an evaluated compression dictionary, the compression code is a condition satisfied code. Thus, before a search for a search range, condition evaluation has been performed on all compression codes that can be present in the search range, and hence condition evaluation can be eliminated in the search.

Furthermore, in the present embodiment, compressed data is a compressed column, and original data (data before compression) of the compressed data is one or more columns among a plurality of columns constituting a table in a database (that is, the column value is an example of a value). The memory 102 stores a compression dictionary 170 therein for the one or more columns. In this manner, high performance can be provided for a search according to a search request in which one or more columns are a search range and which designates a search condition for the search range.

Second Embodiment

A second embodiment is described. In this case, differences from the first embodiment are mainly described, and descriptions of points common to the first embodiment are omitted or simplified.

Figure 7:
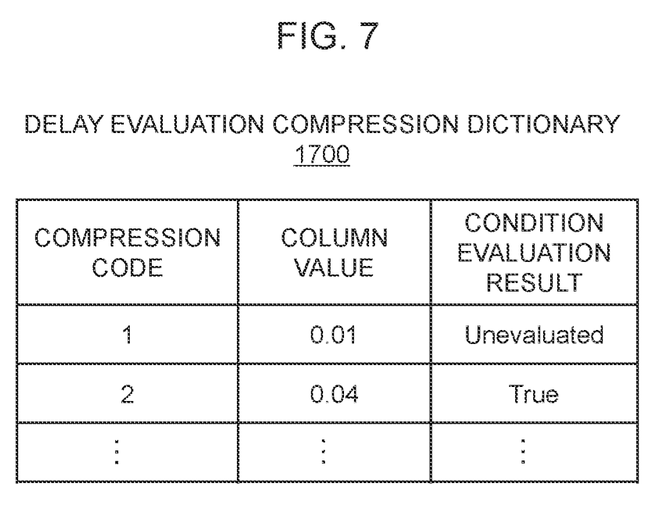
FIG. 7 illustrates a configuration example of an evaluated compression dictionary according to a second embodiment.

FIG. 7 illustrates a configuration example of an evaluated compression dictionary according to the second embodiment.

The number of evaluation dictionary records constituting an evaluated compression dictionary 1700 is the same as the number of dictionary records constituting the compression dictionary 170. In other words, the evaluated compression dictionary 1700 includes all pairs (pair of compression code and column value) in the compression dictionary 170.

Furthermore, each evaluation dictionary record includes a condition evaluation result in addition to a pair of a compression code and a column value. For each column value, the value of a condition evaluation result is "Unevaluated", "True", or "False".

"Unevaluated" is an example of a first result, and means that condition evaluation has not been performed for the column value.

"True" is an example of a second result, and means that condition evaluation has been performed for the column value, and a compression code of the column value is a condition satisfied code.

"False" is an example of a third result, and means that condition evaluation has been performed for the value, and a compression code of the column value is not a condition satisfied code.

In the present embodiment, the evaluated compression dictionary 1700 is used to perform condition evaluation in a search as appropriate.

Figure 8:
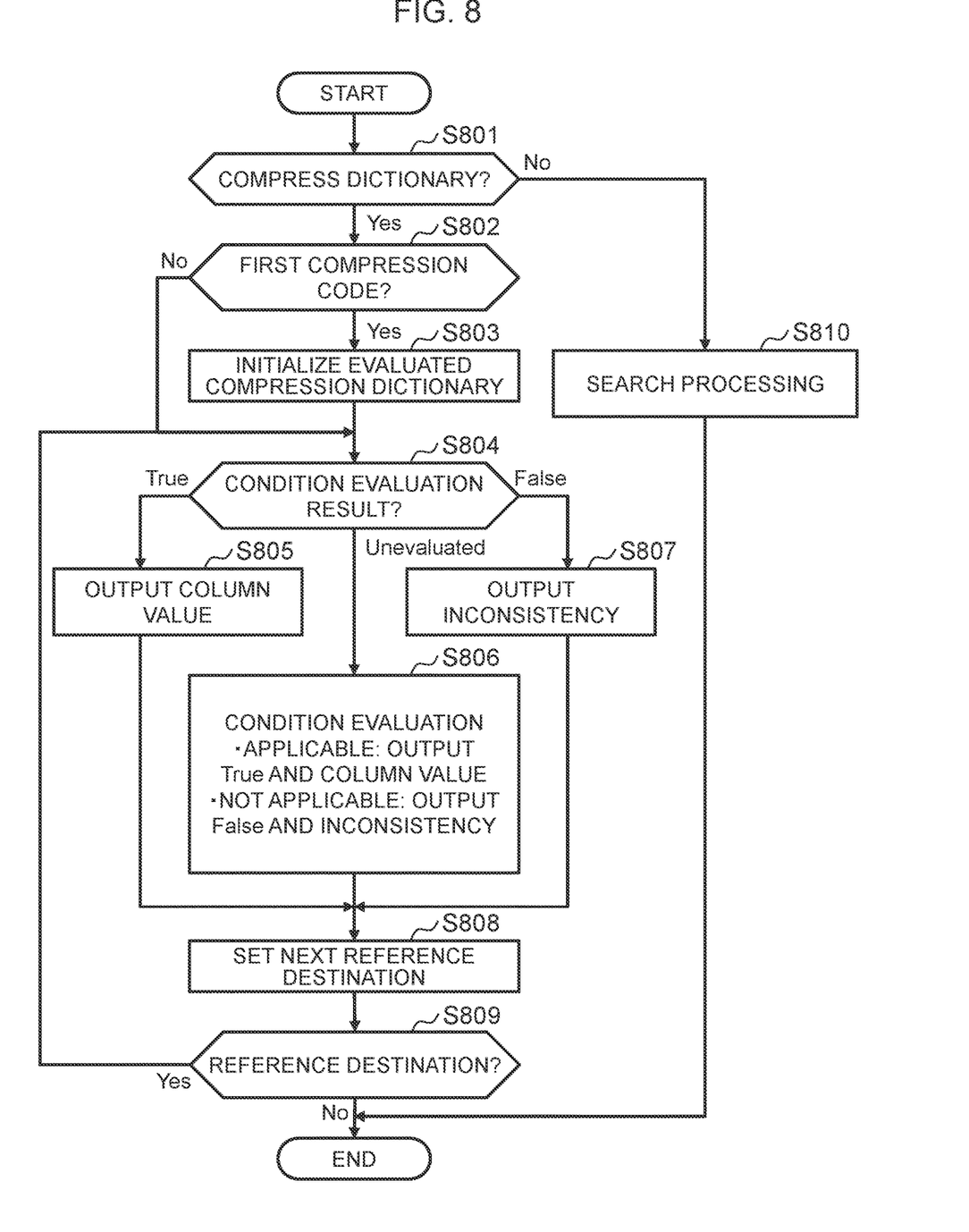
FIG. 8 illustrates an example of the flow of column acquisition processing according to the second embodiment.

FIG. 8 illustrates an example of the flow of column acquisition processing in the second embodiment.

S801 is the same as S601. S802 is the same as S602. S810 is the same as S610.

When a determination result in S802 is true (S802: Yes), the DB processing unit 120 initializes an evaluated compression dictionary for a compressed column corresponding to the search range (S803). Specifically, the DB processing unit 120 acquires a compression dictionary 170 corresponding to the column by the same method as in S603, generates an evaluated compression dictionary from the compression dictionary 170, and sets a condition evaluation result of each evaluation dictionary record in the evaluated compression dictionary to "Unevaluated".

The DB processing unit 120 compares a reference destination compression code in the compressed column with the evaluated compression dictionary, and refers to a condition evaluation result in evaluation dictionary records having a compression code matching the reference destination compression code (S804).

In S804, when the condition evaluation result is "Unevaluated", the DB processing unit 120 performs S806. In S806, the following is performed.

The DB processing unit 120 performs condition evaluation for a column value corresponding to a reference destination compression code.

In the condition evaluation, when the column value satisfies the search condition and thus the compression code matching the reference destination compression code is a condition satisfied code, the DB processing unit 120 updates a condition evaluation result in an evaluation dictionary record having the matched compression code to "True", and outputs a column value in the evaluation dictionary record.

In the condition evaluation, when the column value does not satisfy the search condition and thus the compression code matching the reference destination compression code is not a condition satisfied code, the DB processing unit 120 updates a condition evaluation result in the evaluation dictionary record having the matched compression code to "False", and outputs a value that means inconsistency.

In S804, when the condition evaluation result is "True", the DB processing unit 120 outputs a column value in an evaluation dictionary record having a compression code matching the reference destination compression code (S805).

In S804, when the condition evaluation result is "False", the DB processing unit 120 outputs a value that means inconsistency.

S808, which is performed after S805, S806, or S807, is the same as S606. S809 is the same as S607.

In the present embodiment, condition evaluation is performed in a search as appropriate. Specifically, when a compression code in a compressed column is a compression code of a column value subjected to condition evaluation, a value corresponding to the condition evaluation result is set as an output value without condition evaluation. In this manner, high search performance is provided.

While some embodiments have been described, the embodiments are illustrative of the present invention, and the scope of the present invention is not intended to be limited to the embodiments. The present invention can be implemented by other various forms.

For example, the server 100 may be a server in a cloud such as a public cloud (server instance as cloud computing service) instead of an on-premise server. Furthermore, although the external storage 300 is an object storage, the external storage 300 may be a file storage, and the object 310 may be a file.

Furthermore, in the above, a compression code and a column value always have a one-to-one correspondence for simplifying the description. On the other hand, a code word indicating that data is stored without compression may be included in a compression code, and some code words indicate that uncompressed data is stored in a predetermined scheme after the code word. In this case, when a code indicating non-compression appears as a compression code, the present invention can be applied by adding processing for acquiring uncompressed data on the basis of a predetermined method and determining whether the data satisfies condition each time. In other words, the compression dictionary 170 may have a code word indicating that data is stored without compression as a compression code, and when the DB processing unit 120 detects, in the generation of an evaluated compression dictionary (or in search processing), a code word indicating non-compression as a compression code from the compression dictionary 170 (or evaluated compression dictionary), the DB processing unit 120 may perform processing for acquiring uncompressed data on the basis of a predetermined method and determining whether the data satisfies a condition each time.

The invention claimed is:

1. A storage control apparatus, comprising:
a memory having a compression dictionary stored therein;
a network interface coupled to a network;
a processor, coupled to the network interface, configured to communicate to a database via the network;
wherein the processor compresses one or more columns, of a plurality of columns, of one or more tables, of a plurality of tables, stored in the database according to the stored compression dictionary, and
performs, in response to a search request that designates a search range and a search condition, a search for the search range,
wherein the compression dictionary is data constituted of two or more dictionary records corresponding to two or more different values among a plurality of values included in original data of compressed data,
wherein each of the two or more dictionary records includes any value of the two or more values and a compression code of the value,
wherein the compressed data includes, for each value in the original data, a compression code of the value,
wherein the processor generates, from the compression dictionary, an evaluated compression dictionary constituted of one or more evaluation dictionary records,
wherein each of the one or more evaluation dictionary records includes any of the two or more values in the compression dictionary and a compression code of the value,
wherein the processor performs, by generation or update of the evaluated compression dictionary, a condition evaluation as to whether a value corresponding to the compression code corresponds to the search condition,
wherein a compression code of a value determined to correspond to the search condition in the condition evaluation is a condition satisfied code, and
wherein the processor is configured to, in the search, for a compression code in the search range of the compressed data:
output, when there is an evaluation dictionary record including a condition satisfied code matching the compression code, a value in the evaluation dictionary record; and
output, when there is no evaluation dictionary record including a condition satisfied code matching the compression code, a value indicating an inconsistency,
wherein the evaluated compression dictionary is constituted of two or more evaluation dictionary records corresponding to the different two or more values in the compression dictionary,
wherein for each of the two or more evaluation dictionary records,
the evaluation dictionary record includes any value of the different two or more values, a compression code of the value, and a condition evaluation result including any of first to third results for the value,
the first result means that the condition evaluation has not been performed on the value,
the second result means that the condition evaluation has been performed on the value and a compression code of the value is the condition satisfied code, and
the third result means that the condition evaluation has been performed on the value and a compression code of the value is not the condition satisfied code, and
the processor is configured to, in the search, for each compression code in the search range of the compressed data:
perform, when a condition evaluation result in an evaluation dictionary record including a compression code matching the compression code includes the first result, the condition evaluation on a value corresponding to the compression code, and when the matched compression code is the condition satisfied code, include the second result in the evaluation dictionary record and output a value in the evaluation dictionary record, and when the matched compression code is not the condition satisfied code, include the third result in the evaluation dictionary record and output a value that indicates the inconsistency;
output, when a condition evaluation result in an evaluation dictionary record including a compression code matching the compression code includes the second result, a value in the evaluation dictionary record; and output, when a condition evaluation result in an evaluation dictionary record including a compression code matching the compression code includes the third result, a value that indicates the inconsistency.

2. The storage control apparatus according to claim 1, wherein the compression dictionary is data in which dictionary records are sorted by the processor in a descending or ascending order of values.

3. The storage control apparatus according to claim 1, wherein the processor performs the condition evaluation before a search within the search range, and does not perform the condition evaluation in the search, and wherein each of the one or more evaluation dictionary records includes any of the different two or more values that corresponds to the search condition and a compression code as a condition satisfied code that is a compression code corresponding to the value.

4. The storage control apparatus according to claim 1, wherein the original data is one or more columns among a plurality of columns constituting a table in a database, and wherein the memory stores therein the compression dictionary for the one or more columns.

5. A storage control method, comprising:

communicating, by a computer, with a database via the network;

compressing, by the computer, one or more columns, of a plurality of columns, of one or more tables, of a plurality of tables, stored in the database according to the stored compression dictionary;

receiving, by a computer, a search request that designates a search range and a search condition; and generating from a compression dictionary, by the computer, an evaluated compression dictionary constituted by one or more evaluation dictionary records, wherein the compression dictionary is data constituted of two or more dictionary records corresponding to two or more different values among a plurality of values included in original data of compressed data, wherein each of the two or more dictionary records includes any value of the different two or more values and a compression code of the value, wherein each of the one or more evaluation dictionary records includes any of the different two or more values in the compression dictionary and a compression code of the value, wherein the compressed data includes, for each value in the original data, a compression code of the value, wherein the storage control method comprises, by the computer, performing, by generating or updating of the evaluated compression dictionary, condition evaluation as to whether a value corresponding to the compression code corresponds to the search condition, wherein a compression code of a value determined to correspond to the search condition in the condition evaluation is a condition satisfied code, and wherein the storage control method comprises, by the computer, in the search corresponding to the search request, for a compression code in the search range of the compressed data:

outputting, when there is an evaluation dictionary record including a condition satisfied code matching the compression code, a value in the evaluation dictionary record; and outputting, when there is no evaluation dictionary record including a condition satisfied code matching the compression code, a value that indicates an inconsistency, wherein the evaluated compression dictionary is constituted of two or more evaluation dictionary records corresponding to the different two or more values in the compression dictionary, wherein for each of the two or more evaluation dictionary records, the evaluation dictionary record includes any value of the different two or more values, a compression code of the value, and a condition evaluation result including any of first to third results for the value, the first result means that the condition evaluation has not been performed on the value, the second result means that the condition evaluation has been performed on the value and a compression code of the value is the condition satisfied code, and the third result means that the condition evaluation has been performed on the value and a compression code of the value is not the condition satisfied code, and the processor is configured to, in the search, for each compression code in the search range of the compressed data:

perform, when a condition evaluation result in an evaluation dictionary record including a compression code matching the compression code includes the first result, the condition evaluation on a value corresponding to the compression code, and when the matched compression code is the condition satisfied code, include the second result in the evaluation dictionary record and output a value in the evaluation dictionary record, and when the matched compression code is not the condition satisfied code, include the third result in the evaluation dictionary record and output a value that indicates the inconsistency;

output, when a condition evaluation result in an evaluation dictionary record including a compression code matching the compression code includes the second result, a value in the evaluation dictionary record; and output, when a condition evaluation result in an evaluation dictionary record including a compression code matching the compression code includes the third result, a value that indicates the inconsistency.

* * * * *